(12) United States Patent
Auroux et al.

(10) Patent No.: US 11,127,868 B2
(45) Date of Patent: Sep. 21, 2021

(54) PHOTO-ACTIVATED QUANTUM DOT CAPACITOR PHOTODETECTORS

(71) Applicant: BAE SYSTEMS Information and Electronic Systems Integration Inc., Nashua, NH (US)

(72) Inventors: Pierre-Alain S. Auroux, Rockville, MD (US); Louise C. Sengupta, Ellicott City, MD (US); John E. King, Ellicott City, MD (US); Idan Mandelbaum, Fair Lawn, NJ (US); James A. Stobie, Westford, MA (US); Laura A. Swafford, Baltimore, MD (US); Chen J. Zhang, Clarksville, MD (US); Christopher S. Badorrek, Hagerstown, MD (US); Michael J. Bowers, II, Sykesville, MD (US); Myeongseob Kim, Ellicott City, MD (US); Tadd C. Kippeny, Pasadena, MD (US); Don A. Harris, Columbia, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/799,138

(22) Filed: Oct. 31, 2017

(65) Prior Publication Data
US 2018/0151764 A1   May 31, 2018

Related U.S. Application Data

(60) Provisional application No. 62/427,388, filed on Nov. 29, 2016.

(51) Int. Cl.
*H01L 31/0352* (2006.01)
*H01L 27/30* (2006.01)
(Continued)

(52) U.S. Cl.
CPC ........ *H01L 31/035218* (2013.01); *H01L 27/14652* (2013.01); *H01L 27/307* (2013.01); *B82Y 20/00* (2013.01)

(58) Field of Classification Search
CPC ....... H01L 31/035218; H01L 27/14607; H01L 27/1461; H01L 27/14665; H01L 27/14625;
(Continued)

(56) References Cited

U.S. PATENT DOCUMENTS

| 2007/0174939 | A1* | 7/2007 | Sargent | ................ H01L 51/426 |
| | | | | 438/29 |
| 2010/0133418 | A1* | 6/2010 | Sargent | ................ B82Y 10/00 |
| | | | | 250/208.1 |

(Continued)

OTHER PUBLICATIONS

Nikitskiy et al., Integrating an electrically active colloidal quantum dot photodiode with a graphene phototransistor, Jun. 17, 2016, Nature Communications, DOI: 10.1038/ncomms11954, pp. 1-8.*

*Primary Examiner* — David Chen
(74) *Attorney, Agent, or Firm* — KPIP Law, PLLC; Scott J. Asmus (57) ABSTRACT

A photon-activated quantum dot capacitor and method of fabrication. A photon-activated quantum dot capacitor photodetector having a read only integrated circuit; and a photon-activated quantum dot capacitor chip hybridized with the read only integrated circuit, wherein said photon-activated quantum dot capacitor chip comprises colloidal quantum dots that detect photons as a change in a dielectric constant of the colloidal quantum dots of the photon-activated quantum dot capacitor chip, including the further implementation of a photodetector.

8 Claims, 8 Drawing Sheets

(51) Int. Cl.
*H01L 27/146* (2006.01)
*B82Y 20/00* (2011.01)

(58) Field of Classification Search
CPC . H01L 27/307; H01L 27/14652; B82Y 20/00; B82Y 30/00
USPC ....... 257/21, 226, 432, 440, 448; 438/63, 74
See application file for complete search history.

(56) References Cited

U.S. PATENT DOCUMENTS

| | | | |
|---|---|---|---|
| 2012/0057721 A1* | 3/2012 | Arias-Drake | H04R 19/016 381/94.2 |
| 2014/0161363 A1* | 6/2014 | Sargent | G06K 9/00355 382/224 |
| 2016/0037093 A1* | 2/2016 | Mandelli | H04N 5/32 348/296 |
| 2016/0041030 A1* | 2/2016 | Saxena | G01J 1/46 250/208.2 |
| 2017/0084761 A1* | 3/2017 | Cho | H01L 27/14647 |
| 2017/0222076 A1* | 8/2017 | Furrer | H01L 31/035218 |
| 2018/0145204 A1* | 5/2018 | White | H01L 27/14696 |

* cited by examiner

PHOTO-ACTIVATED QUANTUM DOT CAPACITOR PHOTODETECTORS

CROSS REFERENCE TO RELATED APPLICATION

This application claims priority from U.S. Provisional Application Ser. No. 62/427,388, filed Nov. 29, 2016; the disclosure of which is incorporated herein by reference in its entirety.

FIELD OF THE DISCLOSURE

The present disclosure relates to the structure, fabrication, and application of infrared detectors, and in particular to lower cost, smaller, and lighter imaging devices that consume less power.

BACKGROUND OF THE DISCLOSURE

There is a need to reduce the size, weight, power, and cost of infrared (IR) detectors. Silicon (Si), the most developed semiconductor technology, is inactive in shortwave and midwave infrared (SWIR and MWIR, respectively), so current detectors are composed of alternate semiconductors, such as indium gallium arsenide (InGaAs) and mercury cadmium telluride (MCT). Due to lattice mismatch, these materials are typically grown on substrate wafers other than Si, processed, and then hybridized to Si electronics such as read out integrated circuits (ROICs). This fabrication is more expensive and often less reliable than standard Si-based processes. In addition, these detectors often need to be cooled in order to lower ambient noise.

What is sought after by the industry is a high performance detector for imaging applications and in particular for affordable imaging technology with sufficient performance and ruggedness.

SUMMARY OF THE DISCLOSURE

One aspect of the present disclosure is a photon-activated quantum dot capacitor photodetector, comprising: a read only integrated circuit; and a photon-activated quantum dot capacitor chip hybridized with the read only integrated circuit, wherein said photon-activated quantum dot capacitor chip comprises colloidal quantum dots that detect photons as a change in a dielectric constant of the colloidal quantum dots of the photon-activated quantum dot capacitor chip.

One embodiment of the photon-activated quantum dot capacitor photodetector further comprises an indium-tin-oxide transparent common electrode disposed on a top surface of the colloidal quantum dots.

Another embodiment of the photon-activated quantum dot capacitor photodetector further comprises internal well structures for shields and electrodes proximate an upper surface of the read only integrated circuit.

Another aspect of the present disclosure is a method of manufacturing a photon-activated quantum dot capacitor photodetector, comprising: cleaning a wafer; drying the wafer; spincoating the wafer with colloidal quantum dots; heating the wafer; and stripping the wafer.

One embodiment of the method of manufacturing a photon-activated quantum dot capacitor photodetector further comprises: bumping a device and a read out integrated circuit; flip chip hybridizing the read out integrated circuit and a detector; mounting to a carrier; and wirebonding to the carrier.

Another embodiment of the method of manufacturing a photon-activated quantum dot capacitor photodetector further comprises testing the photon-activated quantum dot capacitor photodetector.

BRIEF DESCRIPTION OF THE DRAWINGS

The foregoing and other objects, features, and advantages of the disclosure will be apparent from the following description of particular embodiments of the disclosure, as illustrated in the accompanying drawings in which like reference characters refer to the same parts throughout the different views. The drawings are not necessarily to scale, emphasis instead being placed upon illustrating the principles of the disclosure.

DETAILED DESCRIPTION OF THE DISCLOSURE

According to one embodiment the present disclosure colloidal quantum dot films are used as light sensitive capacitors and perform a readout using standard readout integrated circuits to produce high performance Complimentary Metal Oxide Semiconductor (CMOS) Shortwave Infrared (SWIR) focal plane arrays. The colloidal semiconductor quantum dots function as an infrared detector medium and are manufactured by chemical synthesis in solution rather than by growth on a substrate. The quantum dots in one example do not require expensive substrates and are not at risk of lattice mismatch, which may cause fracturing in bulk semiconductor growth. A change in the size or composition of the quantum dots tunes the band gap and optical activity of the detector from ultraviolet through midwave infrared ranges.

Figure 1:
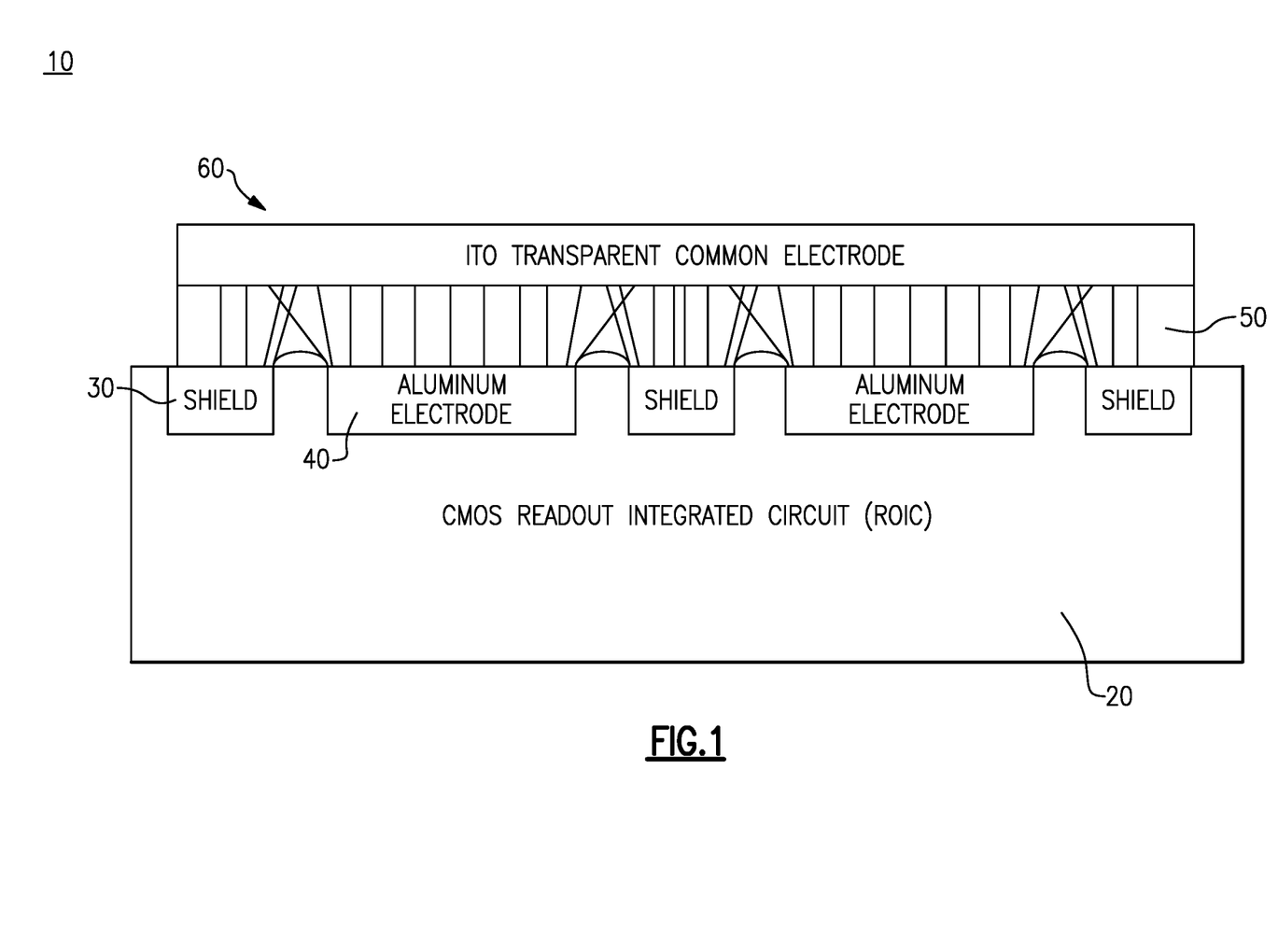
FIG. 1 depicts the Photon Assisted Quantum Dot Capacitor 50 (PAQCap) photodetector according to one embodiment of the present disclosure.

Referring to FIG. 1, a CMOS Readout Integrated Circuit (ROIC) is depicted illustrating one embodiment of the present disclosure. The CMOS device 10 comprises a silicon substrate 20 having a bottom surface and an upper surface. The device has internal well structures for shields 30 and electrodes 40 proximate the upper surface. A region of quantum dots 50 is disposed about the upper surface and in contact with one or more of the shields and electrodes. An ITO (indium-tin-oxide) common electrode 60 is disposed onto the quantum dots 50.

Figure 2:
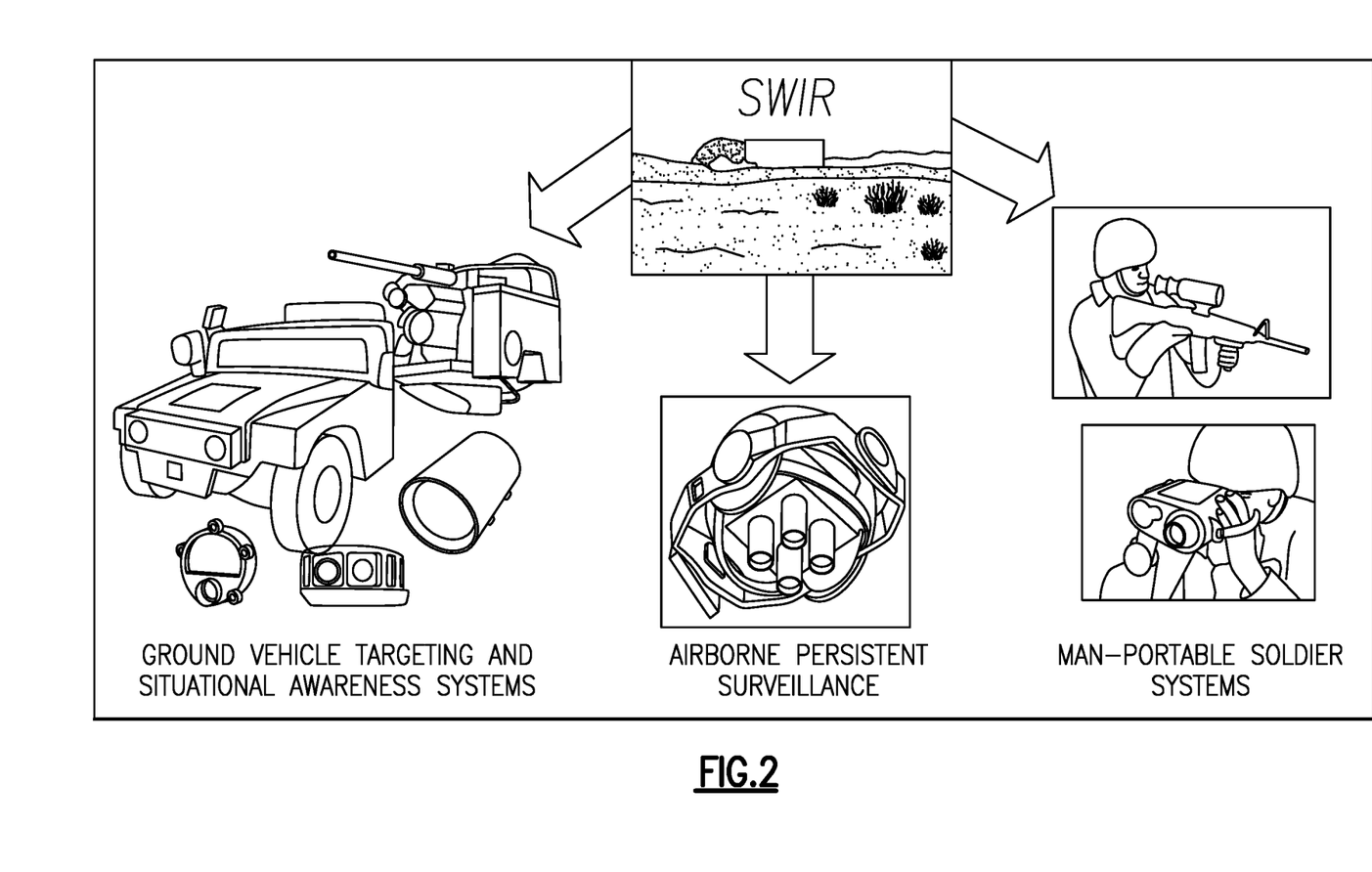
FIG. 2 illustrates some of the potential applications of the photodetector for imaging applications according to one embodiment of the present disclosure.

Referring to FIG. 2, some of the applications that would benefit from the detector detailed herein are shown. More specifically, a camera that utilizes the present detector can operate as a weapon sight, binoculars, vehicle awareness, aircraft tracking and surveillance, and the like. One example includes a low cost extended SWIR imager employing the Photon Assisted Quantum Dot Capacitor (PAGCap) photodetector on the CMOS ROIC.

In one embodiment of the present disclosure, colloidal quantum dot films are used as light sensitive capacitors with readouts using standard Charge Integrating Transimpedance Amplifier (CITA) ROIC to create a high performance CMOS SWIR focal plane array (FPA). In some cases, the quantum dot based thin films on CMOS use changes in medium polarization for light detection and do not require conduction through quantum dots, thereby improving efficiency of exciton sensing. The fabrication process uses spin-coating deposition of the quantum dot which is a scalable and known manufacturing process compatible with CMOS processing technology. The quantum dots and the ITO (indium-tin oxide) electrode allow for visible infrared (VIS), near infrared (NIR), and short wave infrared (SWIR) detection.

Figure 3A:
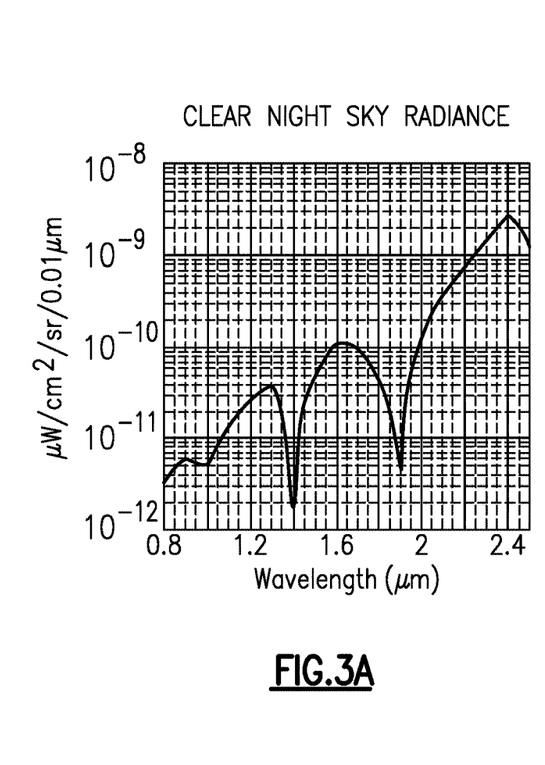
FIGS. 3A and 3B are graphs showing spectral responses according to one embodiment of the present disclosure.
Figure 3B:
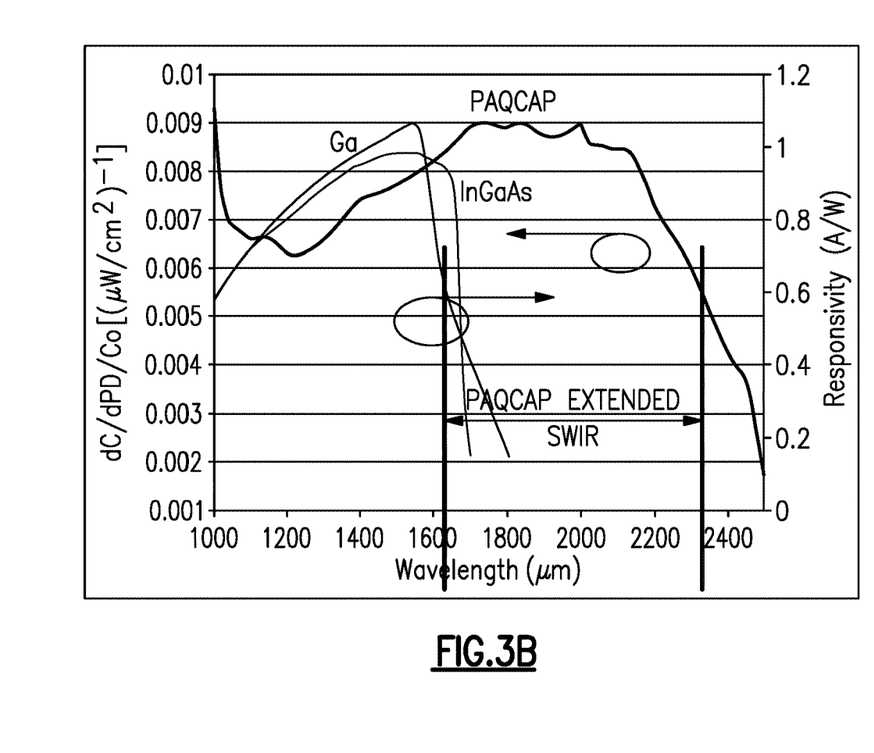

Referring to FIG. 3A, the sky radiance at night with no moonlight is shown. Objects reflect night glow radiance that provide the light source upon which SWIR imagers operate. While typical InGaAs detectors are responsive up to about 1.6 μm, the majority of the night glow, between 1.6 μm and 2.4 μm is outside its spectral responsivity. FIG. 3B shows the expanded spectral response of the PAQcap detector compared to InGaAs and Ge. Note that, the spectral absorbance extends to 2.4 μm beyond the 1.7 μm range of traditional InGaAs SWIR detectors.

Figure 4:
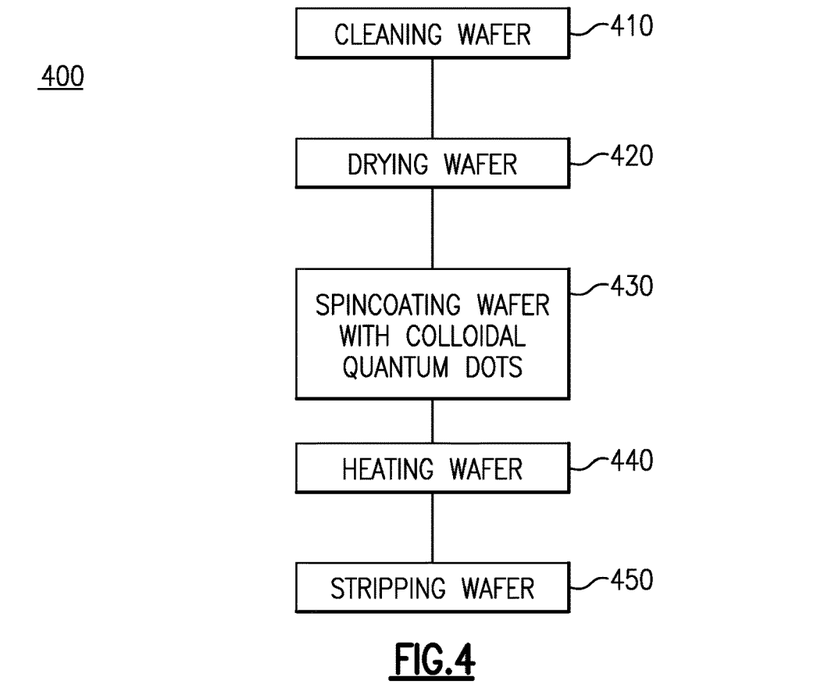
FIG. 4 shows a general flow diagram of a method of making a Photon Assisted Quantum Dot Capacitor (PAQCap) photodetector with colloidal semiconductor quantum dots according to one embodiment of the present disclosure.

Referring to FIG. 4, one embodiment of the method of fabricating the present device 400 is shown, wherein the infrared detector medium is made with colloidal semiconductor quantum dots. According to one embodiment, a silicon wafer is cleaned 410, dried 420, spincoated 430, heated 440, and then stripped 450.

For cleaning 410, the silicon wafer is placed in an acid bath that may be heated. The acid bath optionally includes dihydrogen dioxide in a percentage that constitutes about 20-30% of the acid bath. The silicon wafer is placed in a first water bath and then may be placed in a buffered oxide etch for about thirty seconds. The silicon wafer can also be placed in a second water bath for a period of time over five minutes. The silicon wafer is dried 420 in a dryer and in one example the silicon wafer is dried with nitrogen gas.

The silicon wafer is spincoated with colloidal semiconductor quantum dots 430. The spincoating device may be operated at specific speeds for specific times. For example, the spincoating device may be operated for ten seconds at five hundred rotations per minute. In another example, the spincoating device may be operated for thirty seconds at one thousand rotations per minute. The spincoating device may also be operated at fifteen hundred rotations per minute or at two thousand rotations per minute.

In one embodiment the silicon wafer may be heated 440 at a temperature of about 100 degrees Celsius. The silicon wafer in one example is heated between two to five minutes. In one embodiment of the present disclosure, the silicon wafer may be stripped 450 with a RR2 photoresist remover. The silicon wafer may be stripped in a heated environment such as 110 degrees Celsius for approximately one minute. Upon fabrication, the wafer may also be subjected to post-processing. Table A, below, indicates some of the processes that may be used for post processing and optimization.

TABLE A

| Major Process Steps | Description | Process Method |
|---|---|---|
| 1 | Bottom Electrode—ITO | Sputter deposition, Ion milling |
| 2 | Bottom Electrode—TiAu | Ebeam evaporation, Liftoff |
| 3 | Bottom Electrode Bridge—connect TiAu to ITO | Ebeam evaporation, Liftoff |
| 4 | OD patterning and Top Electrode—TiAu | Drop cast, Ebeam evaporation, Liftoff |
| 5 | ILD—SiO2 and SU8 | Sputter deposition, Spin coat, Ion milling |
| 6 | Interconnect—TiAu | Sputter Deposition, Ion milling |
| 7 | Final passivation and via opening—SiO2 | Sputter deposition, Ion milling |
| 8 | Additional wirebonding pad for top electrode | Ebeam evaporation, Liftoff |
| 9 | barrier and indium bump | Ebeam evaporation, Liftoff |

The detector processing according to one embodiment of the present disclosure includes patterning processes for the quantum dot film. The fabrication processing yields quantum dot patterning to about 10 micron×10 micron structures. In some cases, the entire device is fabricated on patterned quantum dot film. In one embodiment, low temperature lithography was developed to minimize temperature on the quantum dot film due to its sensitivity to high temperature. The low temperature interlayer dielectric (ILD) and passivation was developed to seal the quantum dot and prevent or otherwise mitigate the top interconnect from shorting to the bottom electrode. In another embodiment, ion milling was used to replace dry etching and wet etching since the quantum dot film is less tolerant to wet and dry chemistry.

Figure 5:
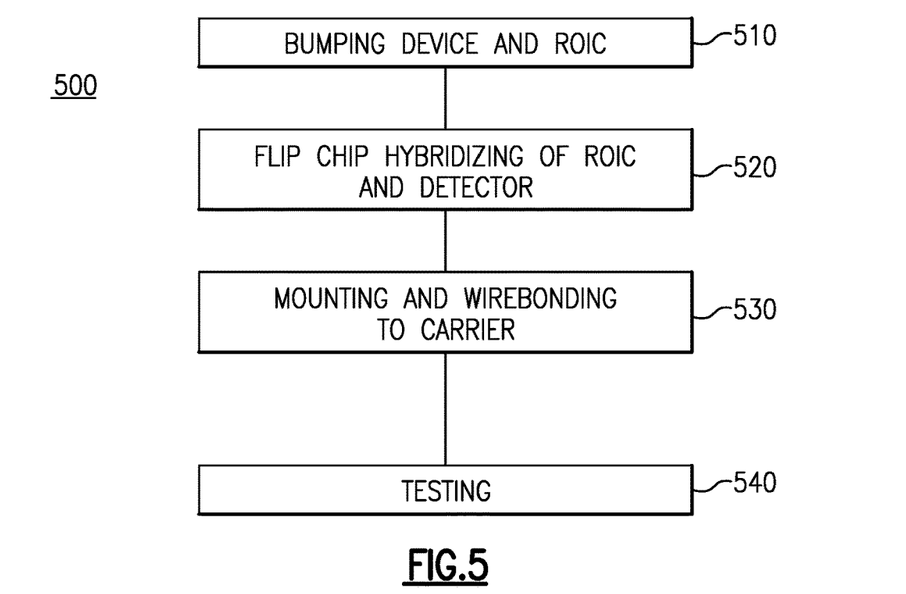
FIG. 5 shows a process flow for hybridization of a Photon Assisted Quantum Dot Capacitor (PAQCap) photodetector with colloidal semiconductor quantum dots according to one embodiment of the present disclosure.
Figure 6A:
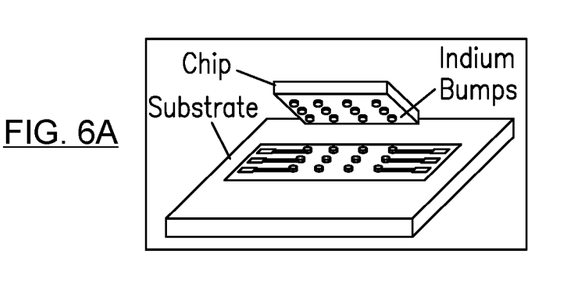
FIG. 6A-FIG. 6D illustrates the post processing for a hybridized ROIC with the Photon Assisted Quantum Dot Capacitor (PAQCap) photodetector according to one embodiment of the present disclosure.
Figure 6B:
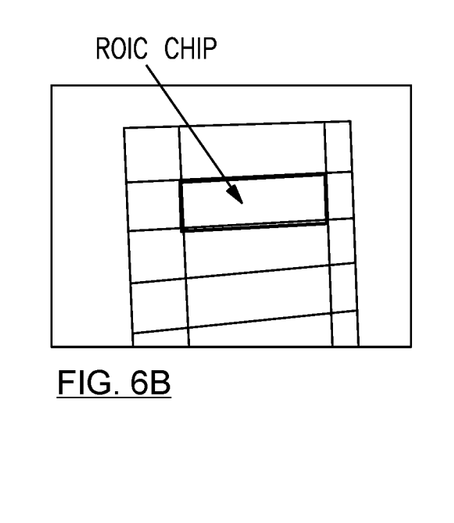
Figure 6C:
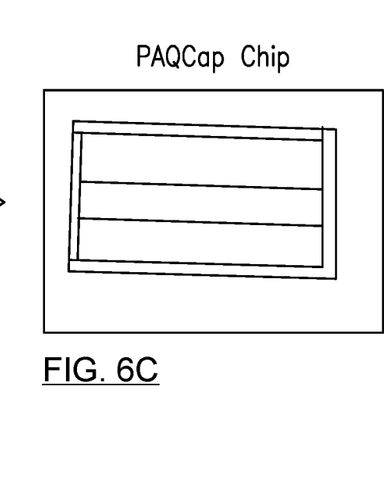
Figure 6D:
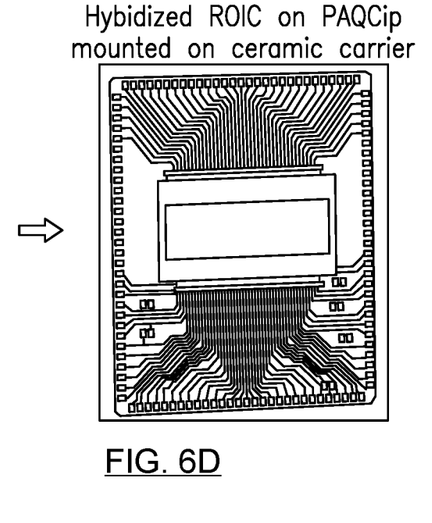

A further processing technique involves the ROIC hybridization 500. Referring to FIG. 5, the ROTC chip and the detector chip are hybridized and mounted to a carrier such as a ceramic carrier. In more particular detail, the detector and ROIC are subjected to indium bump processing 510. Conventional indium bumping processes expose the wafers to temperatures that can exceed 85 degrees Celsius and for more than four hours. Such temperatures could lower yield and lifespan of the eventual devices. According to one embodiment, the indium bumping used for the present wafers was performed at about 95-100 degrees Celsius for less than approximately 90 seconds. This resulted in greater yields and also lowered the tuning of the devices. The detector and ROIC are then flip chip hybridized 520. Final mounting and wirebonding to the ceramic carrier is performed 530. The completed unit may be subject to testing such as by individual unit testing or sample lot testing 540.

Referring to FIG. 6A-6D, the Photon Assisted Quantum Dot Capacitor (PAQCap) according to the principles of the present disclosure is a unique sensor whose capacitance changes with irradiance incident on the sensor. Because of this unique nature, existing readout preamplifier approaches for bolometers or photo-diodes are incompatible. A unique input structure with a preamplifier is necessary to realize two-dimensional imaging arrays of PAQCap detectors. The approach used in this disclosure is to place the PAQCap along with a Compensation Capacitor (Ccomp) in a capacitive divider network, as shown in FIG. 7.

Figure 7:
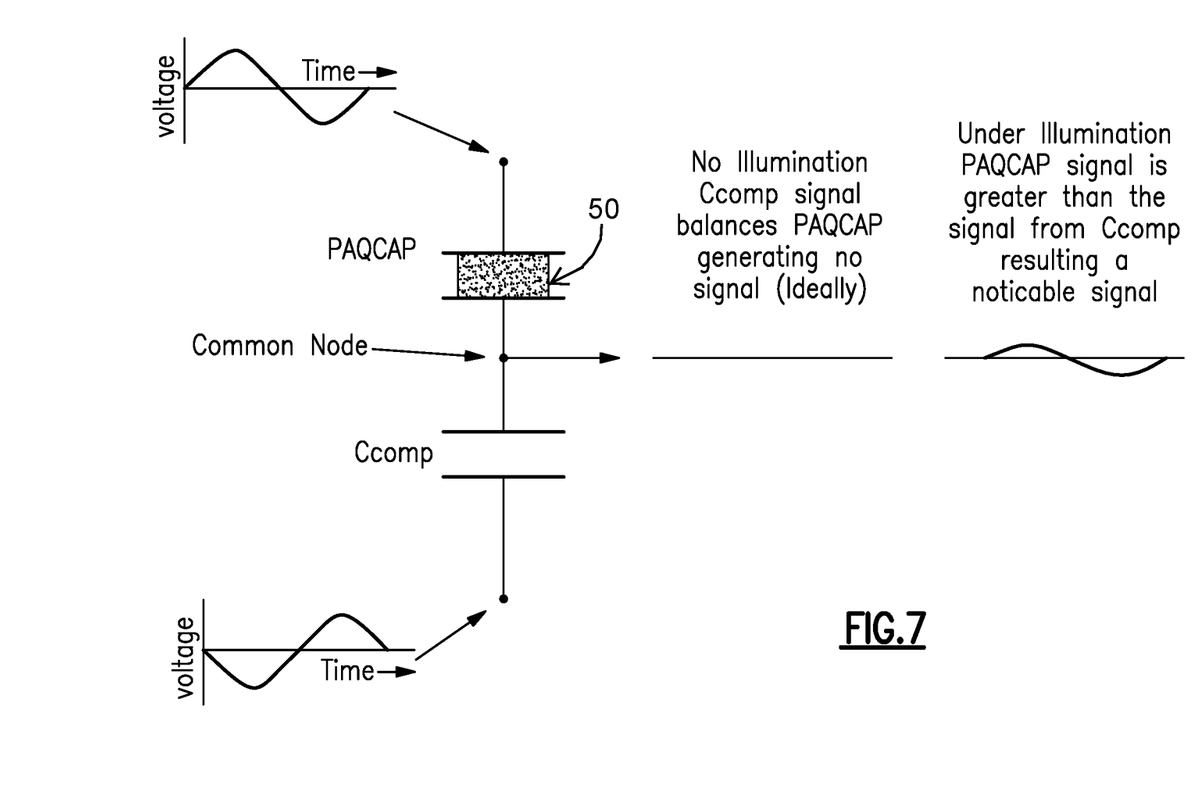
FIG. 7 illustrates a capacitive divider network with the Photon Assisted Quantum Dot Capacitor (PAQCap) along with a compensation Capacitor (Ccomp) according to one embodiment of the present disclosure.

Referring to FIG. 7, varying AC signal of opposite polarity is applied to the open plate of each capacitor and the common plate node B between the two capacitors can be monitored. Under a fixed illumination condition the signal applied at C, to Ccomp is adjusted to compensate for the signal coming from A from the Photon Assisted Quantum Dot Capacitor so that no voltage change occurs at the common node B of the capacitive divider. Then as the irradiance on the PAQCap 50 increases, causing its capacitance to increase, the common node voltage will also become unbalanced and a voltage swing can be observed. The small voltage signal at the common node is due to the net charge changing. By coupling this common node to the input of a Charge Integrating Transimpedance Amplifier (CITA) the voltage signal can be amplified and buffered with relatively low drive impedance suitable for standard signal processing and multiplexing used by today's CMOS readout integrated circuits (ROICs).

Figure 8:
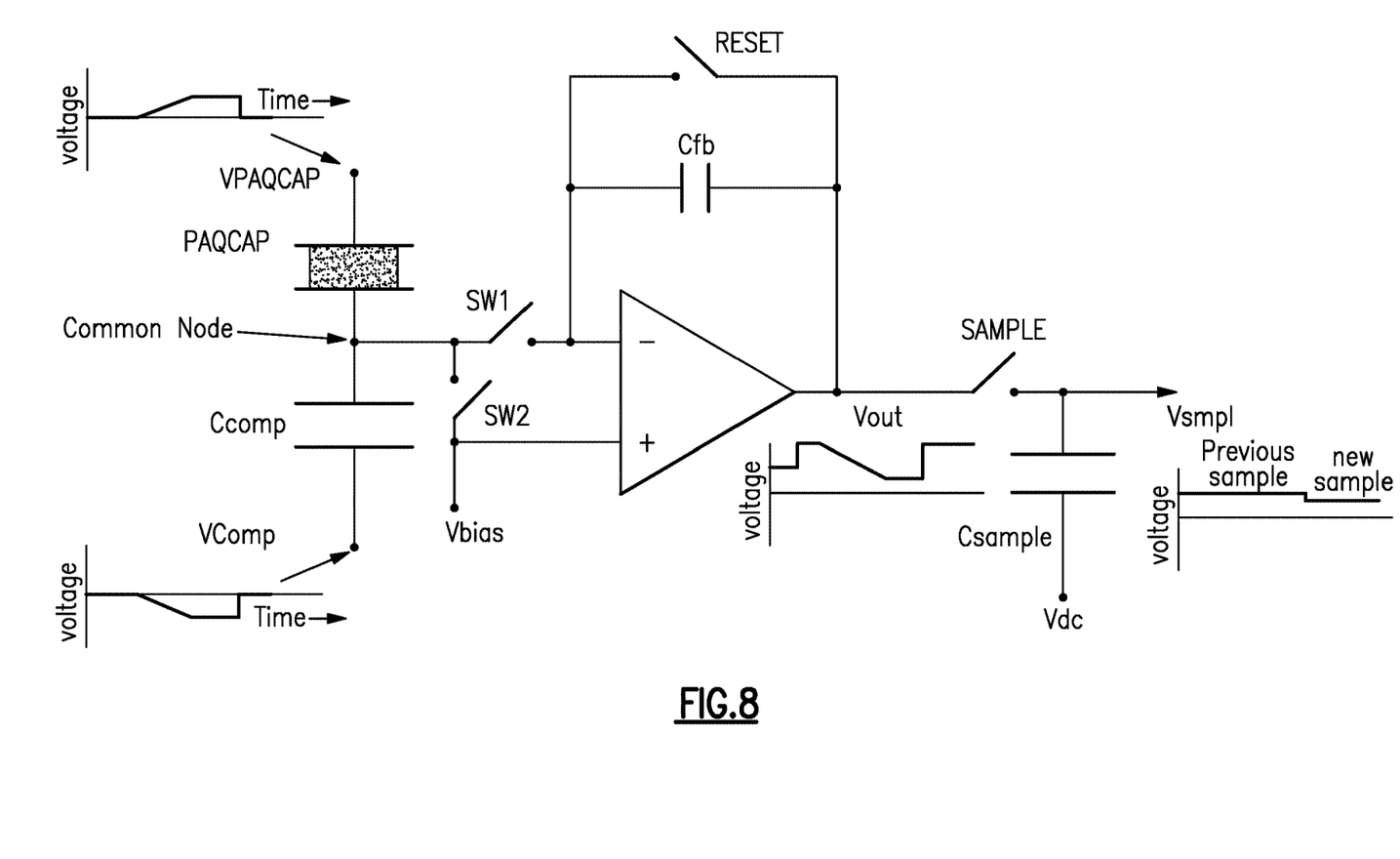
FIG. 8 illustrates a Charge Integrating Transimpedance Amplifier (CITA) for monitoring the net change in charge at the common node of a Photon Assisted Quantum Dot Capacitor (PAQCap) divider which is a measure of to changes in the irradiance according to one embodiment of the present disclosure.

The circuit diagram, for one embodiment of this disclosure, is shown in FIG. 8. More specifically, the circuit consists of the capacitive divider containing the Photon Assisted Quantum Dot Capacitor and Ccomp, a high gain differential amplifier, a feedback capacitor (Cf), a sample capacitor (Csmpl), and four switches. In certain embodiments, the common node of the capacitive divider is connected to the inverting input node of the differential amplifier through an on/off switch, SW1. The feedback capacitor is located between the amplifier output and the inverting input, and a reset switch is placed across this capacitor. The non-inverting input is held at a DC bias voltage, Vbias. In some cases, a third switch, SW2, connects this Vbias to the capacitive divider common node. The last switch, labeled Sample, connects the amplifier output, Vout, to the sample capacitor, Csmpl. Since the change in Photon Assisted Quantum Dot Capacitor capacitance is relatively small compared to the no-light capacitance of the device, the value of Cf should be quite small, e.g., sub-femto farads, to provide adequate transimpedance gain.

In order to measure the change of the capacitor of the Photon Assisted Quantum Dot Capacitor photodetector, one technique involves chopping the device. In some cases, the opposite phase of the chopping signal is used to remove offset charge through Ccomp at near the response time of the Photon Assisted Quantum Dot Capacitor photodetector. Amplitude can be adjusted to handle non-uniformity (global). In one example, a rolling chopper is used with a repeating signal every millisecond or so to allow offset compensation data to be continuously downloaded to perform pixel-by-pixel compensation. SW1 and SW2 are opposite phase and used to interrupt integration during the falling edge of the chopped signal. While integration is interrupted, SW2 connects the summing node to Vbias to remove charge information from previous sub-frame integration. During the next sub-frame integration, SW1 is closed.

Figure 9:
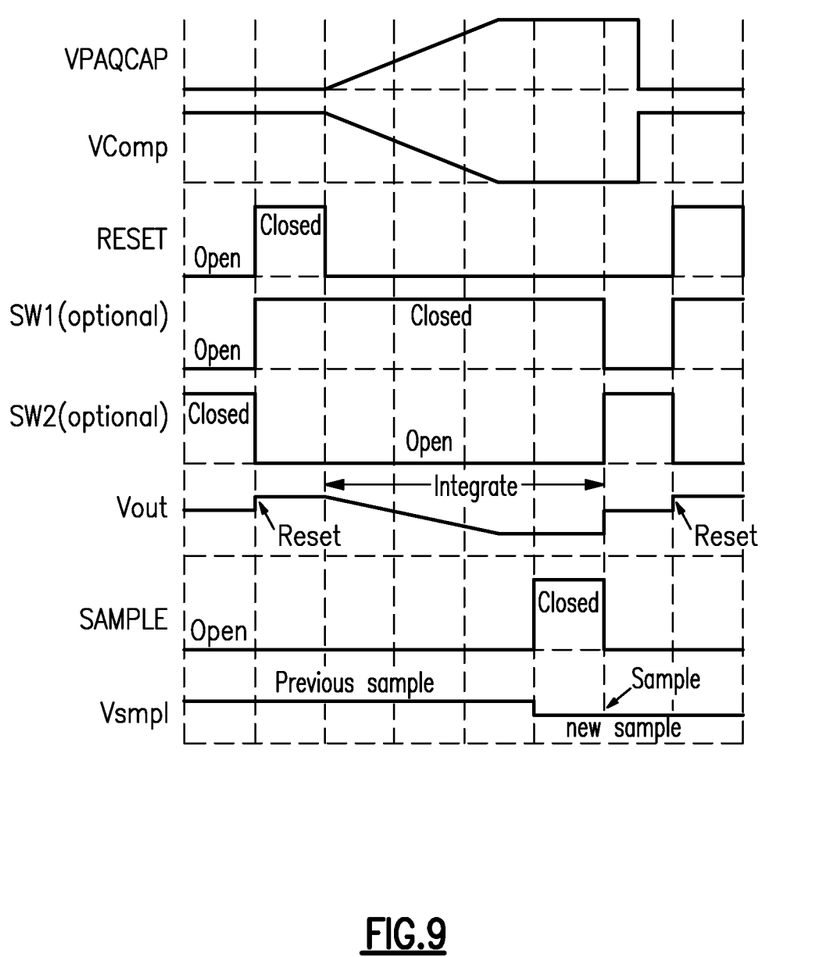
FIG. 9 is a timing diagram for the Charge Integrating Transimpedance Amplifier (CITA) Photon Assisted Quantum Dot Capacitor (PAQCap) divider input unit cell circuit according to one embodiment of the present disclosure as shown in FIG. 8.

One possible timing diagram to operate this circuit is shown in FIG. 9. In this example the capacitor divider is simulated by pulsed waveforms with opposite polarity. The leading edge of the V-Photon Assisted Quantum Dot Capacitor and Vcomp pulses are intentionally slow to insure mismatch between the opposing polarity signals are small, due to non-uniformity in timing generation or even jitter, to prevent the preamplifier from saturating. Eventually, the pulses reach a plateau where they remain until reset and the cycle repeats. Starting on the left in the figure, SW1 is open and SW2 is closed while the capacitive divider signals are at their reset level. This resets the common node to Vbias voltage. Next SW2 is opened, followed by SW1 and 2 RESET both closing. This resets Cf and the amplifier output. When the RESET switch opens the CITA is allowed to integrate signal charge from the common node of the capacitance divider. Shortly afterwards the voltages for V-Photon Assisted Quantum Dot Capacitor and Vcomp start changing. After they reach their plateau levels, the integrated output voltage is sampled onto Csmpl. This sample voltage represents the charge imbalance of the capacitor divider and is a measure of the Photon Assisted Quantum Dot Capacitor capacitance. The cycle is completed by opening SW1 and closing SW2 followed by the reset of the capacitor divider pulse signal.

Repetitive cycles represent an electronically chopped input designed to measure the change in PAQCap capacitance. The modulation in the output sampled voltage corresponds to a modulation of the irradiance incident on the PAQCap causing a change in its capacitance value. The circuit is simple enough to fit within a small input unit cell using today's CMOS processes. An array of input cells and corresponding PAQCaps are configurable to make an ROIC using traditional CMOS readout techniques.

Many variations of this approach are possible. For instance, the two switches labeled SW1 and SW2 are optional and were included to avoid having the preamplifier saturate when the capacitor divider input signals were rapidly reset. The SAMPLE switch and Csmpl provide a convenient means to sample all the detectors in the sensor at the same time, providing what is known is an electronic "snap shot" operation. An alternative input could exclude these elements and provide a "rolling" readout using a simpler input unit cell. Even the differential amplifier could be replaced with a single-ended inverting amplifier for a smaller unit cell.

The present disclosure provides for a detector that offers benefits in terms of size, weight, power, and cost relative to current infrared detectors. The quantum dot synthesis via wet chemical synthesis is a relatively inexpensive process as compared to current fabrication processes. Other than quantum dot synthesis, the present processing is based on silicon technology and is CMOS-compatible. This greatly reduces expenses incurred by other IR technologies and the detector devices can be made by monolithic integration of quantum dots directly onto the ROIC. Monolithic integration reduces cost by eliminating detector substrate and hybridization processes. It also reduces size, because the size of pixels produced by direct patterning of quantum dots on the ROIC wafer are not limited by the minimum size of solder bumps required to hybridize a detector array to an ROIC.

By using colloidal quantum dots as a capacitive layer rather than as a semiconducting layer, as in most quantum dot-based detectors, the present detectors take advantage of the extremely low conductance of this material. By using colloidal quantum dots, the present detector eliminates or at least greatly reduces the high dark current noise due to leakage from stray conduction paths through the semiconducting layer of a typical photodetector. By eliminating this noise source, it eliminates the need for cooling, thus further reducing the size, weight, power, and cost of the resulting imager.

The quantum dots are also broadband absorbers and have the potential to detect light over more than one band (e.g., UV-Vis, Vis-SWIR, or NIR-MWIR), as opposed to some traditional IR detectors (e.g., InGaAs detectors). The band over which the quantum dots are active can easily be tuned by changing quantum dot size and/or composition through small changes in the synthetic process. This contrasts to bulk semiconductors, whose optoelectronic properties are dictated solely by composition, and whose growth is sometimes restricted by the lack of substrates with appropriate lattice characteristics.

In one embodiment, the means by which colloidal quantum dots are processed are determined almost exclusively by the properties of the surface organic material. By choosing an appropriate surface organic, it is possible to tune the band(s) over which the detector is active by changing the size and/or composition of the quantum dots but without any other changes to the detector fabrication process. This is absolutely unique to colloidal quantum dots. Therefore, colloidal quantum dots of different sizes and/or compositions can be mixed together before or during deposition to broaden or tailor the active band(s), thus providing greater sensitivity over desired portions of the spectrum. For example, HgTe quantum dots of 3 nm in diameter will emit at about 1,200 nm, while quantum dots of 10 μm in diameter will emit around 1,600 nm.

The Photon Assisted Quantum Dot Capacitor device of the present disclosure can be used for multiple embodiments with various SWIR implementation with respect to military and law enforcement applications such as ground vehicle targeting and situational awareness systems, airborne persistent surveillance, man-portable soldier systems and the like.

In certain embodiments, the Photon Assisted Quantum Dot Capacitor chip is bonded on a ROIC die such as by indium bumps for CMOS readout circuits. In one example, a SWIR detector with noise equivalent power (NEP) of InGaAs was at a cost point to allow broad applicability. Wirebonding technologies were used to mount the integrated die on carriers such as ceramic.

In a further example, the Photon Assisted Quantum Dot Capacitor detects light at wavelengths at which the quantum dots absorb. Since quantum dots of varying compositions and size absorb from the UV to MWIR, this device is used as both a simple detector or for imaging in any of these wavelength ranges. It is thus used for dual- or multiband imaging (e.g., Vis-SWIR, Vis/MWIR).

In another example, the detector employs colloidal semiconductor quantum dots as the detector medium. Semiconductor quantum dots are identical in composition to standard ("bulk") semiconductors, but the largest dimension of a quantum dots is on the nanometer scale. Quantum dots are sufficiently small that their optical and electronic properties differ from those of the bulk material, and these properties vary with size. Colloidal quantum dots additionally have a layer of organic material, often a surfactant, surrounding the exterior of the semiconductor material. They are manufactured by chemical synthesis in solution rather than by growth on a substrate. Therefore, they do not require expensive substrates, such as many IR-active materials, and there is no lattice mismatch, which can cause faults and fracturing in bulk semiconductor growth.

By changing the composition and/or size of the quantum dots, the band gap and optical activity can be tuned from UV through MWIR. In a Photon Assisted Quantum Dot Capacitor chip, colloidal quantum dots are employed as the dielectric layer in a capacitor. When light is absorbed by the quantum dots, each absorbed photon generates an electron-hole pair confined to the absorbing quantum dots. This results in an increase in the dipole moment of the quantum dots, which in turn changes the capacitance of the dielectric layer. This change is then read out using capacitive transimpedance amplifiers (CTIAs).

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure.

What is claimed is:

1. A photon-activated quantum dot capacitor imaging sensor, comprising:
   a complementary metal oxide semiconductor (CMOS) readout integrated circuit comprising a compensation capacitor; and
   a photon-activated quantum dot capacitor photodetector hybridized with the CMOS readout integrated circuit, wherein a capacitance of the photon-activated quantum dot capacitor photodetector changes with irradiance incident on the imaging sensor;
   the compensation capacitor and the photon-activated quantum dot capacitor photodetector form a capacitive divider network having a common node, and
   wherein the photon-activated quantum dot capacitor photodetector comprises a plurality of colloidal quantum dots acting as a capacitive dielectric layer that detect photons as a change in a dielectric constant of the colloidal quantum dots and provide a voltage at the common node and wherein the plurality of colloidal quantum dots reduces high dark current noise.

2. The photon-activated quantum dot capacitor imaging sensor of claim 1, further comprising an indium-tin-oxide transparent common electrode disposed on a top surface of the colloidal quantum dots.

3. The photon-activated quantum dot capacitor imaging sensor of claim 1, further comprising internal well structures for shields and electrodes proximate an upper surface of the CMOS readout integrated circuit.

4. The photon-activated quantum dot capacitor imaging sensor according to claim 1, wherein the colloidal quantum dots are broadband absorbers and detect light over more than one band.

5. The photon-activated quantum dot capacitor imaging sensor according to claim 1, further comprising coupling the common node to an input of a Charge Integrating Transimpedance Amplifier wherein the photon-activated quantum dot capacitor photodetector is used in CMOS compatible sensors.

6. The photon-activated quantum dot capacitor imaging sensor according to claim 1, wherein the colloidal quantum dots are covered by a surface organic material.

7. The photon-activated quantum dot capacitor imaging sensor according to claim 1, wherein the colloidal quantum dots have different sizes and/or compositions and configured to detect light over more than one band.

8. The photon-activated quantum dot capacitor imaging sensor according to claim 2, further comprising a low temperature interlayer dielectric (ILD) to seal the colloidal quantum dots.

\* \* \* \* \*